United States Patent
Rhee et al.

(10) Patent No.: US 7,728,393 B2
(45) Date of Patent: Jun. 1, 2010

(54) SEMICONDUCTOR DEVICE

(75) Inventors: Hwa-sung Rhee, Seongnam-si (KR); Tetsuji Ueno, Suwon-si (KR); Ho Lee, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 160 days.

(21) Appl. No.: 11/492,939

(22) Filed: Jul. 26, 2006

(65) Prior Publication Data

US 2007/0023847 A1     Feb. 1, 2007

(30) Foreign Application Priority Data

Jul. 26, 2005   (KR) ...................... 10-2005-0067992

(51) Int. Cl.
    *H01L 29/76*     (2006.01)
(52) U.S. Cl. .............. 257/408; 257/E29.266; 438/300
(58) Field of Classification Search ................ 257/335, 257/408, E29.266; 438/300
See application file for complete search history.

(56) References Cited

U.S. PATENT DOCUMENTS

| | | | |
|---|---|---|---|
| 6,228,730 B1 * | 5/2001 | Chen et al. ................ | 438/301 |
| 6,326,664 B1 | 12/2001 | Chau et al. | |
| 6,410,429 B1 * | 6/2002 | Ho et al. .................... | 438/655 |
| 6,815,770 B1 * | 11/2004 | Chien et al. ................ | 257/344 |
| 2003/0166323 A1 | 9/2003 | Vietzke et al. | |
| 2004/0072395 A1 * | 4/2004 | Liu ............................ | 438/197 |

FOREIGN PATENT DOCUMENTS

| | | |
|---|---|---|
| JP | 2001-068673 | 3/2001 |
| KR | 10-0221608 B1 | 6/1999 |
| KR | 10-2004-0002215 A | 1/2004 |
| KR | 10-2004-0058666 A | 7/2004 |
| KR | 10-2004-0098302 | 11/2004 |

OTHER PUBLICATIONS

Shimizu, "Local Mechanical-Stress Control (LMC): A New Technique for CMOS-Performance Enhancement", 2001, IEEE.*
Korean Notice of Allowance dated Apr. 11, 2008 for corresponding Korean Patent Application No. 10-2007-0001596.

* cited by examiner

*Primary Examiner*—Kiesha R Bryant
*Assistant Examiner*—Tucker Wright
(74) *Attorney, Agent, or Firm*—Harness, Dickey & Pierce, P.L.C.

(57) ABSTRACT

A semiconductor device and method of manufacturing the semiconductor device are provided. The semiconductor device may include a semiconductor substrate, a gate insulation layer and a gate electrode, a first spacer, a second spacer, an epitaxial pattern, and/or source/drain regions. The gate insulation layer and the gate electrode may be formed on the semiconductor substrate. The first spacer may be formed on sidewalls of the gate electrode. The second spacer may be formed on sidewalls of the first spacer. The epitaxial pattern may be formed between the second spacer and the semiconductor substrate such that an outside profile of the epitaxial pattern is aligned with an outside profile of the second spacer. The source/drain regions may include primary source/drain regions that are aligned with the first spacer. The primary source/drain regions may be formed in the epitaxial pattern and the semiconductor substrate. The source/drain regions may also include secondary source/drain regions that are aligned with the second spacer and formed in the semiconductor substrate.

16 Claims, 14 Drawing Sheets

SEMICONDUCTOR DEVICE

PRIORITY STATEMENT

This application claims the benefit of priority under 35 U.S.C. §119 from Korean Patent Application No. 10-2005-0067992, filed on Jul. 26, 2005, in the Korean Intellectual Property Office, the disclosure of which is incorporated herein in its entirety by reference.

BACKGROUND OF THE INVENTION

1. Field of the Invention

Example embodiments of the present invention relate to a semiconductor device and method of manufacturing the same. Other example embodiments relate to a semiconductor device having a structure capable of mitigating a short channel effect and a resistance characteristic that attributes to primary source/drain regions and simultaneously allows strain to be more effectively applied to a channel region, increasing characteristics of the semiconductor device. Other example embodiments relate to a method of manufacturing the same.

2. Description of the Related Art

The trend in semiconductor manufacturing has been to manufacture compact, light and thin electrical devices. As such, semiconductor devices have become more highly integrated such than an effective channel length of a gate thereof decreases. As the effective channel length of the gate decreases, a short channel effect occurs. As the short channel effect may deteriorate a punch-through characteristic between a source electrode and a drain electrode.

In order to increase the punch-through characteristic, a shallow junction source/drain structure wherein source and drain regions may be formed as an extending structure may be produced. By forming the source and drain regions as the extending structure, the short channel effect may be controlled (or mitigated).

It is well-known in the conventional art that the short channel effect may be mitigated (or controlled) by forming the extending structure including shallow source/drain regions. However, as the source/drain regions become shallower, resistance of the source/drain regions may increase.

SUMMARY OF THE INVENTION

Example embodiments relate to a semiconductor device and method of manufacturing the same. Other example embodiments relate to a semiconductor device having a structure capable of mitigating a short channel effect and a resistance characteristic that attributes to primary source/drain regions and simultaneously allows strain to be more effectively applied to a channel region, increasing characteristics of the semiconductor device.

Example embodiments provide a semiconductor device having a structure capable of mitigating a short channel effect and a resistance characteristic that attributes to source/drain regions and allows strain to be more effectively applied to a channel region to increase mobility of carriers (e.g., electrons or holes).

Other example embodiments provide a method for manufacturing a semiconductor device.

According to example embodiments, a semiconductor device is provided. The semiconductor device may include a semiconductor substrate having a gate insulation layer and a gate electrode formed thereon, a first spacer formed on sidewalls of the gate electrode, a second spacer formed on sidewalls of the first spacer, an epitaxial pattern formed between the second spacer and the substrate wherein an outside profile of an epitaxial pattern is aligned with an outside profile of the second spacer and/or source/drain regions. The source/drain regions may include primary source/drain regions that are aligned with the first spacer and/or secondary source/drain regions that are aligned with the second spacer. The primary source/drain regions may be formed in the epitaxial pattern and the substrate. The secondary source/drain regions may be formed in the substrate.

Example embodiments the present invention also provide a method of manufacturing a semiconductor device, the method may include providing a semiconductor substrate, forming a gate insulation layer and a gate electrode on the semiconductor substrate, forming a first spacer on sidewalls of the gate electrode, forming an epitaxial layer on the semiconductor substrate exposed by the first spacer, forming primary source/drain regions that may be aligned with the first spacer in the epitaxial layer and the semiconductor substrate under the epitaxial layer, forming a second spacer that may be formed on the epitaxial layer and on the first spacer, forming secondary source/drain regions that may be aligned with the second spacers and/or forming an epitaxial pattern wherein an outside profile of the epitaxial pattern may be aligned with an outside profile of the second spacer. The epitaxial pattern may be formed by etching the epitaxial layer using the second spacer as an etching mask after or prior to forming the secondary source/drain regions.

BRIEF DESCRIPTION OF THE DRAWINGS

Example embodiments will be more clearly understood from the following detailed description taken in conjunction with the accompanying drawings. FIGS. 1-25 represent non-limiting, example embodiments as described herein.

FIG. 2 is a diagram illustrating a sectional view of a semiconductor device according to example embodiments;

FIG. 3 is a flowchart illustrating a process of manufacturing a semiconductor device according to example embodiments;

FIGS. 4 to 13 are diagrams illustrating sectional views of the process of manufacturing a semiconductor device according to example embodiments;

FIGS. 14 to 16 are diagrams illustrating sectional views of the process of manufacturing a semiconductor device according to example embodiments;

FIGS. 17 to 22 are diagrams illustrating sectional views of the process of manufacturing a semiconductor device according to example embodiments; and FIGS. 23 to 25 are diagrams illustrating sectional views of the process of manufacturing a semiconductor device according to example embodiments.

DETAILED DESCRIPTION OF EXAMPLE EMBODIMENTS

Figure 1A:
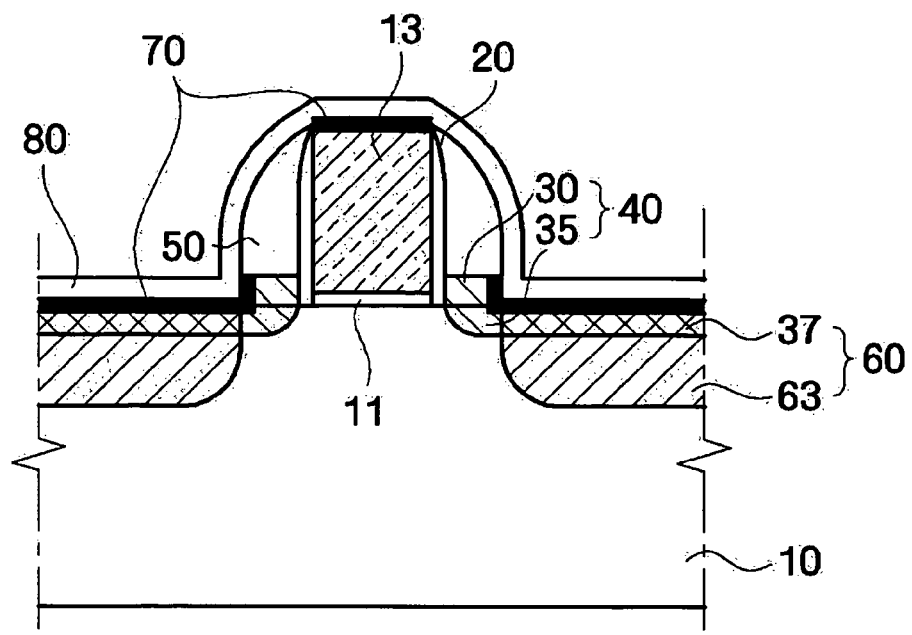
FIGS. 1A and 1B are diagrams illustrating sectional views of a semiconductor device according to example embodiments.

Various example embodiments will now be described more fully with reference to the accompanying drawings in which some example embodiments of the invention are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation that is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to the example embodiments described.

Example embodiments relate to a semiconductor device and method of manufacturing the same. Other example embodiments relate to a semiconductor device having a structure capable of mitigating a short channel effect and a resistance characteristic that attributes to the primary source/drain regions and simultaneously allows strain to be more effectively applied to a channel region, increasing characteristics of the semiconductor device.

Hereinafter, a semiconductor device according to example embodiments will be described with reference to FIGS. 1A and 1B.

FIG. 1A is a diagram illustrating a section of a semiconductor device according to example embodiments.

Referring to FIG. 1A, the semiconductor device may include a gate insulation layer 11 and a gate electrode 13 on a semiconductor substrate 10. A silicide layer 70 may be formed on the gate electrode 13. Sidewalls of the gate electrode 13 may be surrounded by a first spacer 20. A second spacer 50 may be formed outside (or external to) the first spacer 20.

Source/drain regions may be formed at sides of the gate electrode 13. The source/drain regions include primary source/drain regions 40 and secondary source/drain regions 60.

The gate electrode 13 may be a single layer of polysilicon, metal, metal silicides with doped impurities or a mixture thereof. However, example embodiments are not limited thereto.

Each of the primary source/drain regions 40 may have an elevated structure. The primary source/drain regions 40 may be formed in primary doped regions 35a of an epitaxial pattern 30. The primary doped regions 35a may be positioned between the second spacer 50 and the semiconductor substrate 10 aligned with an outside profile of the second spacer 50. The primary source/drain regions 40 may be formed in the primary doped regions 35 of the semiconductor substrate 10 under the epitaxial pattern 30. The epitaxial pattern 30 may be formed of silicon.

When controlling diffusion of impurities and increasing the carrier mobility of a channel region in the semiconductor substrate 10 below the gate electrode 13 are taken into consideration, it may be desirous to form the epitaxial pattern 30 of silicon germanium (SiGe) where p-type dopants are injected into the source/drain regions and silicon carbon (SiC) where n-type dopants are injected into the source/drain regions.

In the primary source/drain regions 40, an appropriate level of junction depth may be maintained by forming the elevated epitaxial pattern 30. As such, a short channel effect may decrease in the primary source/drain regions 40 because the primary doped regions 35, which are formed in the semiconductor substrate 13, are shallow. The primary doped regions 35 (hereinafter interchangeably referred to as 'extension regions 35') may be extending portions of the source/drain regions. Deterioration of a resistance characteristic of the semiconductor device due to a shallow junction may be mitigated (or controlled) by elevating the epitaxial pattern 30. A silicide layer may also be provided on a side surface of the elevated epitaxial pattern 30. As such, the resistance characteristic of. the primary source/drain regions 40 may be further mitigated (or controlled).

An ion injection peak, (e.g., Projection Range (hereinafter referred to as 'Rp')) formed by injecting dopants, may be adjusted such that the ion injection peak is formed at a surface of the semiconductor substrate 13 such that a junction profile of the extension regions 35 formed in the semiconductor substrate 10 may be improved. In the extension regions 35 having the improved junction profile, a source-drain leakage characteristic in a sub-threshold region may be mitigated (or controlled).

Secondary source/drain regions 60 may be aligned with the second spacer 50. Secondary doped regions 37 in the secondary source/drain regions 60 may be injected with two quantities (e.g., twofold) of dopants in order to form primary source/drains and secondary source/drains. The tertiary doped regions 63 may be injected with one quantity of dopants to form secondary source/drains.

Each of the secondary source/drain regions 60 may not have an elevated or recessed structure in contrast to the semiconductor substrate 10. Each of the secondary source/drain regions 60 may be aligned with an upper surface area of the semiconductor substrate 10. The upper surface area of the semiconductor substrate 10 refers to an area extending upward by about 10 nm and downward by about 10 nm from the upper surface of the semiconductor substrate 10. A structure formed at the upper surface area of the semiconductor substrate 10 may apply strain to a channel region in contrast to an elevated structure. The structure formed at the upper surface area of the semiconductor substrate 10 may improve a short channel effect and/or junction leakage in contrast to a recessed structure wherein the recessed portion is directed towards the semiconductor substrate 10.

A silicide layer 70 may be formed on the source/drain regions. With reference to FIG. 1A, the silicide layer 70 may be formed on the gate electrode 13, a side surface of the epitaxial pattern 30 and/or the secondary source/drain regions 60. If the gate electrode 13 is formed of polysilicon layers, silicide layers may be formed on the gate electrode 13.

An enhancer layer 80 may be formed on the source/drain regions. The enhancer layer is a layer for generating (or exhibiting) tensile strength or compressive strength to improve the mobility of carriers. For instance, depending on the type of semiconductor device, electrons or holes may form in the channel region formed below the gate electrode 13. Stress may be applied to the enhancer layer 80. Stress may also be applied to an active region, which is below the enhancer layer 80, in the general direction of the stress applied to the enhancer layer 80. For example, when the tensile strength is generated (or exhibited) in the enhancer layer 80, tensile strength may also be generated (or exhibited) in the active region below the enhancer layer 80 as a result of the tensile strength of the enhancer 80. In other example embodiments, when the compressive strength is generated (or exhibited) in the enhancer layer 80, compressive strength may also be generated (or exhibited) in the active region below the enhancer layer 80.

In the source/drain regions into which the p-type dopants are injected, it may be desirous that the enhancer layer 80 be formed of a material that generates (or exhibits) a desired compressive strength. When the desired compressive strength is generated (or exhibited) in the active region located below the enhancer layer 80, the mobility of holes may increase in the channel region located below the gate electrode 13 due to the compressive strength of the enhancer layer 80. The material that generates (or exhibits) the desired compressive strength may be SiN, $SiO_2$, SiON or the like. However, example embodiments are not limited thereto.

In the source/drain regions into which the n-type dopants are injected, it may be desirous that the enhancer layer 80 be formed of a material that generates (or exhibits) a desired tensile strength. When tensile strength is generated (or exhibited) in the active region located below the enhancer layer 80, the mobility of electrons may increase in the channel region located below the gate electrode 13 due to the tensile strength of the enhancer layer 80. The material that generates (or exhibited) the desired tensile strength may be SiN, $SiO_2$, SiON or the like. However, example embodiments are not limited thereto.

As shown in FIG. 1, the semiconductor device according to example embodiments may be provided with the enhancer layer 80 on an upper surface of the secondary source/drain regions 60 aligned with the upper surface area of the semiconductor substrate 10. Strain may be more effectively applied in order that characteristics of the semiconductor device may improve. The enhancer layer 80 may function as an etching stop layer in an etching process (e.g., a process of forming contact holes).

Figure 1B:
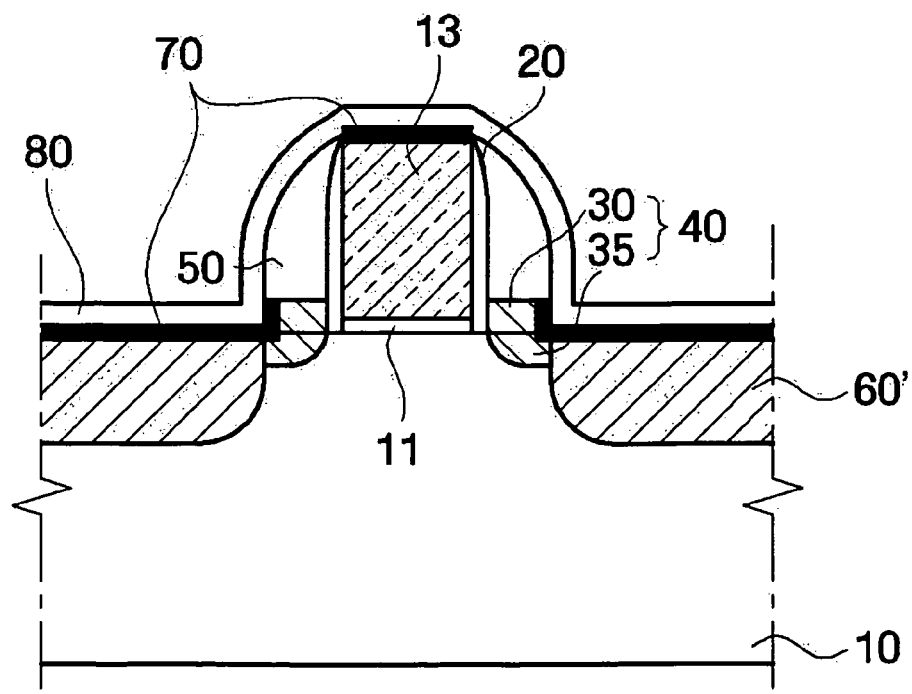

FIGS. 1B is a diagram illustrating sectional views of a semiconductor device according to example embodiments. Like reference numerals designate like elements, and thus detailed descriptions thereof will be omitted for the sake of brevity.

Referring to FIG. 1B, the semiconductor device may have a complementary metal oxide silicon (CMOS) device including the above-described NMOS device (which the n-type dopants are injected) and/or a PMOS device (in which the p-type dopants are injected).

Secondary source/drain regions 60' may be formed on a buried epitaxial layer (not shown), which is formed in a semiconductor substrate 10. The secondary source/drain regions. 60' may not overlap a buried epitaxial layer (e.g., the secondary source/drain regions 60' may be formed deeper or shallower than the buried epitaxial layer). When controlling diffusion of impurities and/or improving the carrier mobility of a channel region in the semiconductor substrate 10 below the gate electrode 13 are taken into consideration, it may be desirous that the buried epitaxial layer be formed of SiGe when p-type dopants are injected into the source/drain regions and SiC material when n-type dopants are injected into the source/drain regions.

Figure 2:
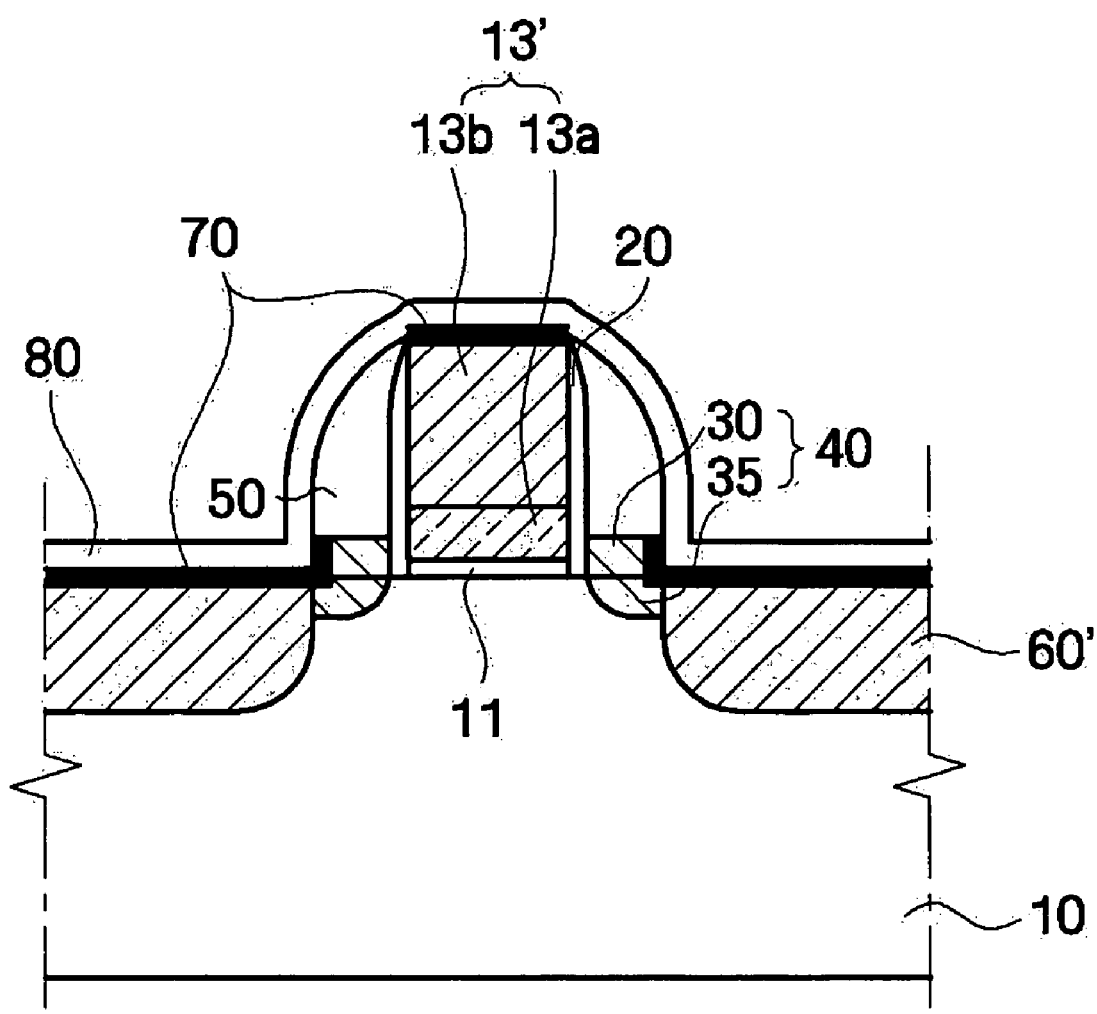

FIG. 2 is a diagram illustrating a sectional view of a semiconductor device according to example embodiments. Like reference numerals designate like elements, and thus detailed descriptions thereof will be omitted for the sake of brevity.

Referring to FIG. 2, a gate electrode 13' may be a stack structure including a polysilicon gate layer 13a and an epitaxial gate layer 13b. The epitaxial gate layer 13b may be formed on the polysilicon gate layer 13a by an epitaxial process. For instance, in a PMOS device, the epitaxial gate layer 13b may include silicon (Si) or silicon germanium (SiGe) doped with impurities. In an NMOS device, the epitaxial gate layer 13b.may include Si or silicon-carbon (SiC) doped with impurities.

The secondary source/drain regions 60' may be formed on the buried epitaxial layer in the semiconductor substrate 10. The same descriptions with reference to FIG. 1B apply hereto. The secondary source/drain regions 60' and the epitaxial gate layer 13b may include the same type of impurities and/or elements.

Hereinafter, a method of manufacturing a semiconductor device according to example embodiments will be described with reference to FIGS. 3 to 13. Like reference numerals designate like elements, and thus detailed descriptions thereof will be omitted for the sake of brevity.

Figure 3:
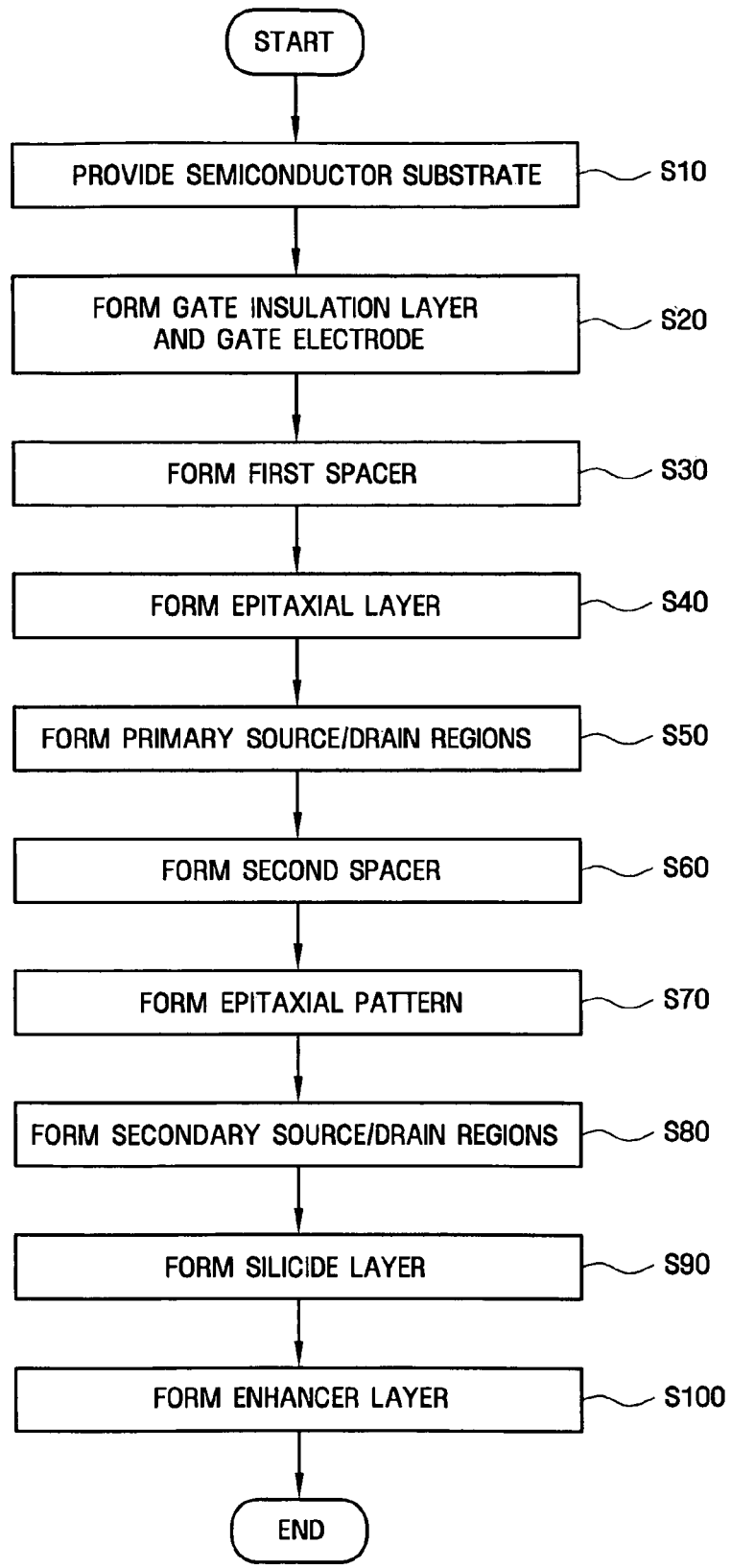

FIG. 3 is a flowchart illustrating a process of manufacturing a semiconductor device according to example embodiments. FIGS. 4 to 13 are diagrams sequentially illustrating sectional views of the process of manufacturing a semiconductor device according to example embodiments.

Figure 4:
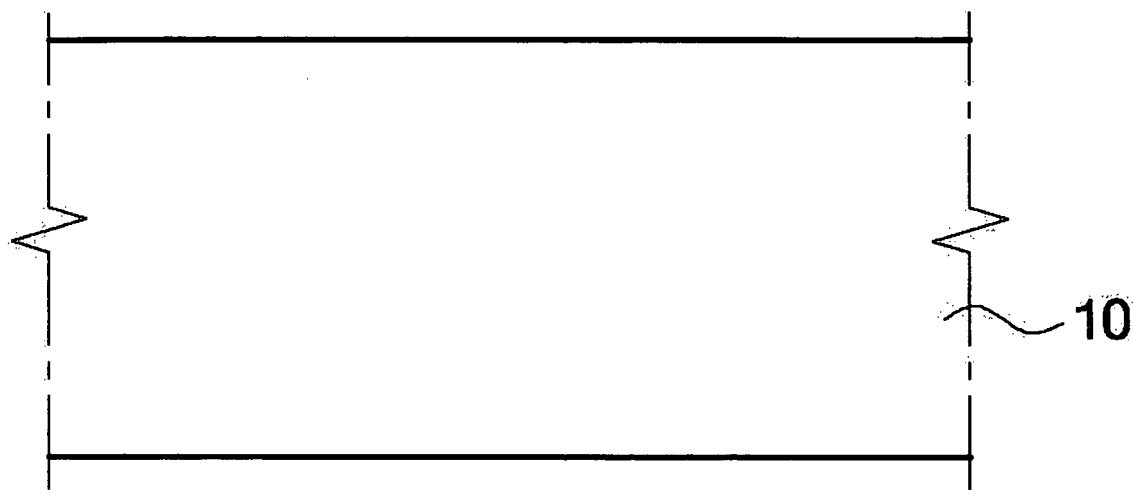

Referring to FIGS. 3 and 4, a semiconductor substrate 10 is provided S10. Device isolation regions (not shown) may be formed in a semiconductor substrate 10 to define active regions. The semiconductor substrate 10 may be formed of at least one semiconductor material selected from a group including Si, Ge, SiGe, GaP, GaAs, SiC, SiGeC, InAs, InP, a silicon-on-insulator substrate (SOI), or the like. Example embodiments are not limited thereto.

A gate insulation layer and a gate electrode may be formed S20.

Figure 5:
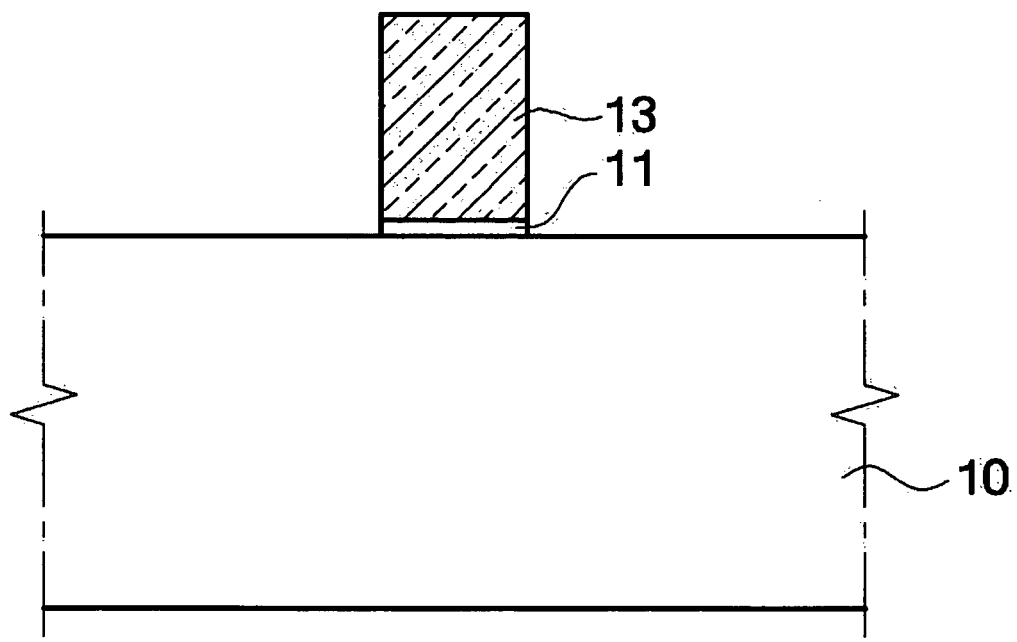

Referring to FIG. 5, the gate electrode 13 may be formed on the gate insulation layer 11 formed on the semiconductor substrate 10.

The gate insulation layer 11 may function as a silicon oxide layer formed by thermally oxidizing the semiconductor substrate 10, SiON, $Ge_xO_yN_z$, $Ge_xSi_yO_z$, high-k materials, combinations thereof. The silicon oxide layer may be formed by thermally oxidizing a stacked layer including the semiconductor substrate 10, SiON, $Ge_xO_yN_z$, $Ge_xSi_yO_z$, high-k materials, combinations thereof, sequentially stacked. The high-k materials may be formed of $HfO_2$, $ZrO_2$, $Al_2O_3$, $Ta_2O_5$, hafnium silicate, zirconium silicate or combinations thereof.

The gate electrode 13 may include a doped polysilicon layer. Hereinafter, a gate electrode 13 formed of a doped polysilicon layer will be described in accordance with other example embodiments, however the example embodiments are not limited thereto. The gate electrode 13 may be a single layer of polysilicon, metal or metal silicate. The gate electrode 13 may be a stacked structure including a polysilicon layer and a metal layer, but the example embodiments are not limited thereto.

Although not shown in the drawings, an oxidation process may be performed after the gate electrode is formed in order to form another oxide layer on the upper surface of the semiconductor substrate 10 and the gate electrode 13. The gate insulation layer and the gate electrode may be formed by processes well-known to those skilled in the art.

A first spacer may be formed S30.

Figure 6:
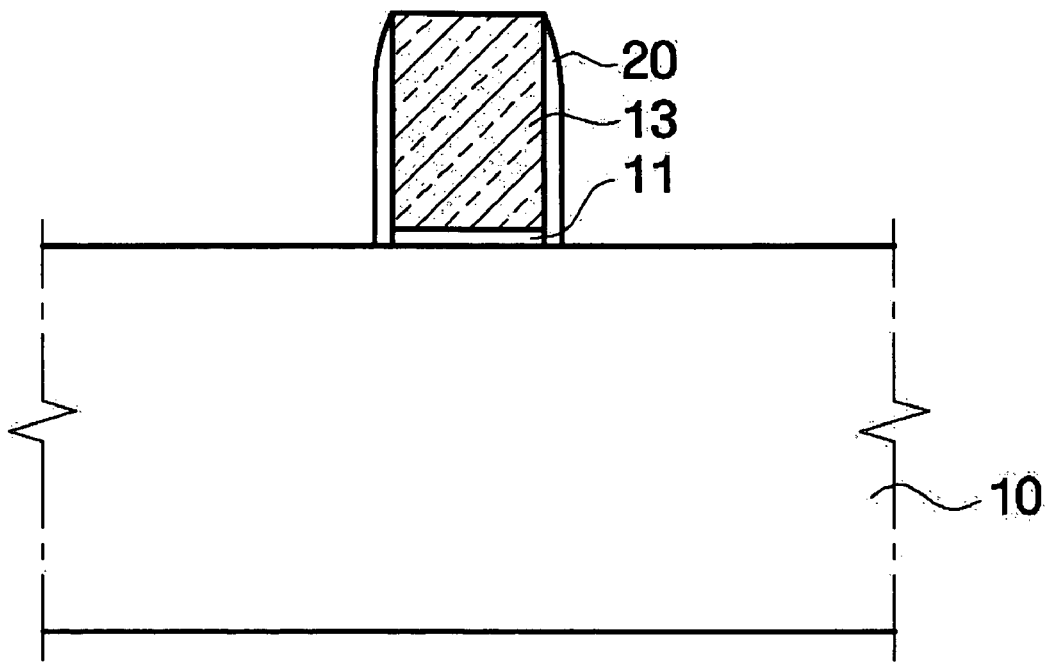

Referring to FIG. 6, the first spacer 20 surrounding sidewalls of the gate electrode 13 may be formed. When primary source/drain regions 40 (which will be described later), are formed, the first spacer 20 may reduce a short channel effect by adjusting a profile of the extension regions 35 formed in the semiconductor substrate 10.

Although not shown in the drawings, an oxide layer may also be formed on the semiconductor substrate 10 after the first spacer 20 is formed.

An epitaxial layer may be formed S40.

Figure 7:
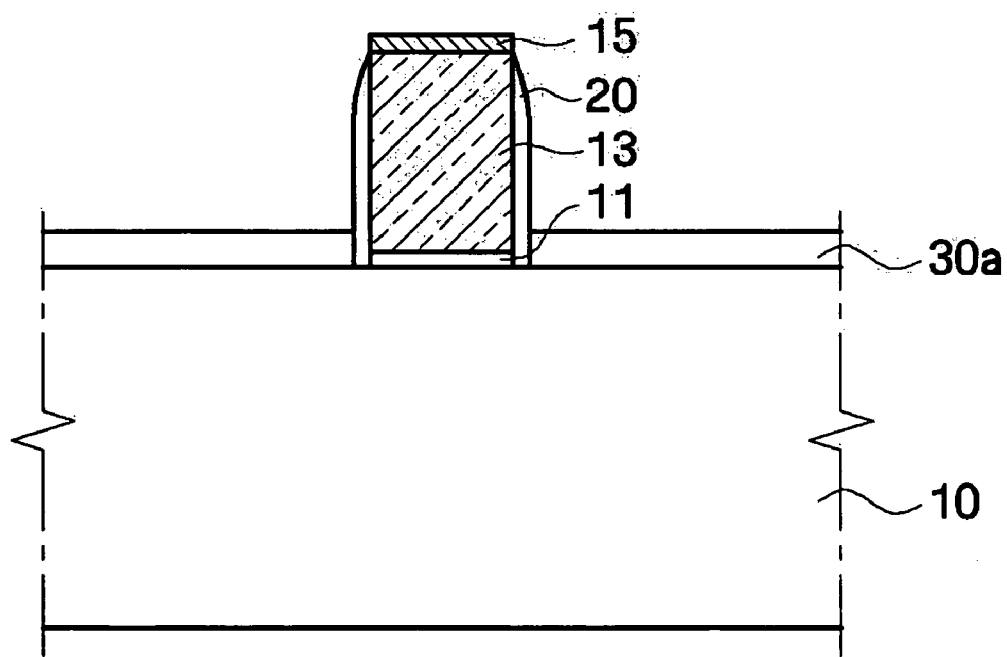

Referring to FIG. 7, the epitaxial layer 30a may be formed on lower portions of sidewalls of the first spacer 20 and/or on an upper surface of the semiconductor substrate 10 to a desired thickness. The desired thickness of the epitaxial layer 30a may be determined such that the Rp of the primary source/drain regions 40 may be formed at the upper surface area of the semiconductor substrate 10. The epitaxial layer 15 may be formed from the same materials as the gate electrode 13, which is formed of polysilicon layers.

The epitaxial layer 30a may be formed of silicon (Si), silicon germanium (SiGe), or silicon carbon (SiC) material. It may be desirous to form the epitaxial layer 30a of a Si or SiGe material where dopants injected to the source/drain regions are of a p-type. It may be desirous to form the epitaxial layer 30a of a Si or SiC material where dopants injected to the source/drain regions are of an n-type. The epitaxial layer 30a may be formed using a selective epitaxial growth (SEG) process (e.g., a Low Pressure Chemical Vapor Deposition (LPCVD) method or an Ultra-High Vacuum Chemical Vapor Deposition (UHV-CVD) method). The epitaxial layer 30a may be formed using any method appreciated in the art. When the epitaxial layer 30a is formed of the SiGe or SiC material, the epitaxial layer 30a may be formed by injecting a germanium (Ge) or carbon (C) material into the Si material in an in-situ or ex-situ manner. When the epitaxial layer 30a is formed, dopants injected into the primary source/drain regions 40 may be doped in situ.

Sources of silicon (Si) may include $Si_2H_6$, $SiH_4$, $SiH_2Cl_2$, $SiHCl_3$ and/or $SiCl_4$. A source of germanium (Ge) may include $GeH_4$. Sources of carbon (C) may include $C_xH_y$ and/or $CH_3SiH_3$. However, example embodiments are not limited thereto. A gas (e.g., HCl or $Cl_2$) may be added to improve a selectivity characteristic the epitaxial layer 30a. A gas (e.g., $B_2H_6$, $PH_3$, or $AsH_3$) may be added when doping is desired. When the HCl gas is added, selective epitaxial growth (SEG) may occur wherein the epitaxial layer may not formed in the device isolation regions formed of an oxide layer or a nitride layer. During selective epitaxial growth, the epitaxial layer may be formed in a region wherein the Si material is exposed. SEG processes are well-known to those skilled in the art as such detailed descriptions thereof are omitted.

Primary source/drain regions 40 may be formed S50.

Figure 8:
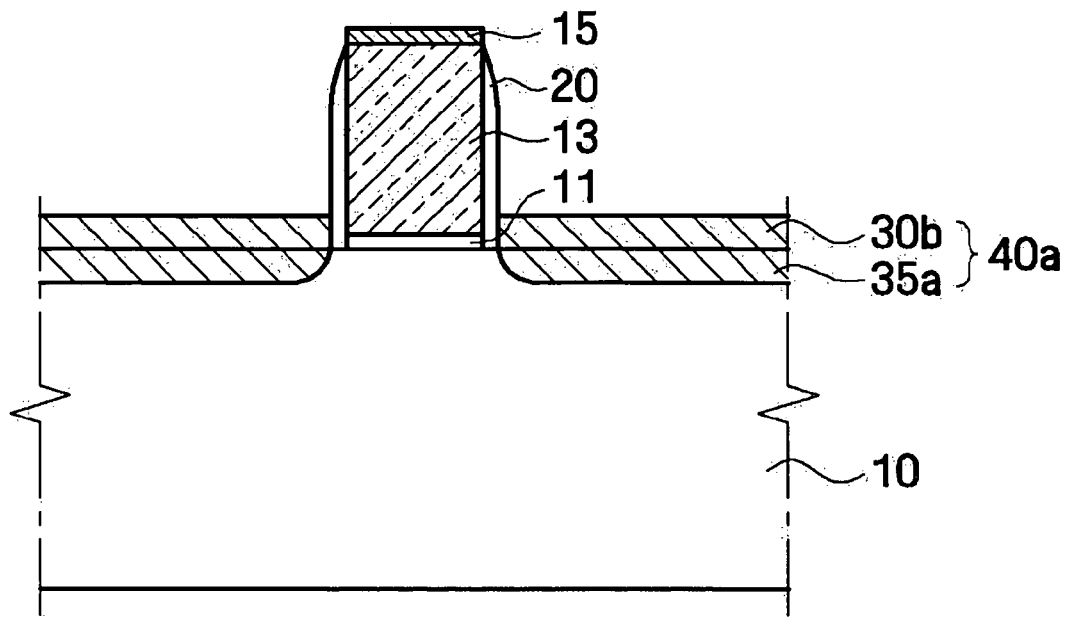

Referring to FIG. 8, dopants may be injected into the epitaxial layer 30a such that the dopants are injected into the semiconductor substrate 10 and the epitaxial layer 30a to a desired depth. As such, another epitaxial layer 30b, wherein the dopants are injected, and extension regions 35a may be formed. The extension regions 35a may be formed in the semiconductor substrate 10. The Rp, depending on the dopants injected, may be formed at the upper surface area of the semiconductor substrate 10. Profiles of the extension regions 35a formed in the semiconductor substrate 10 may be aligned with the outside walls of the first spacer 20.

A second spacer may be formed S60.

Figure 9:
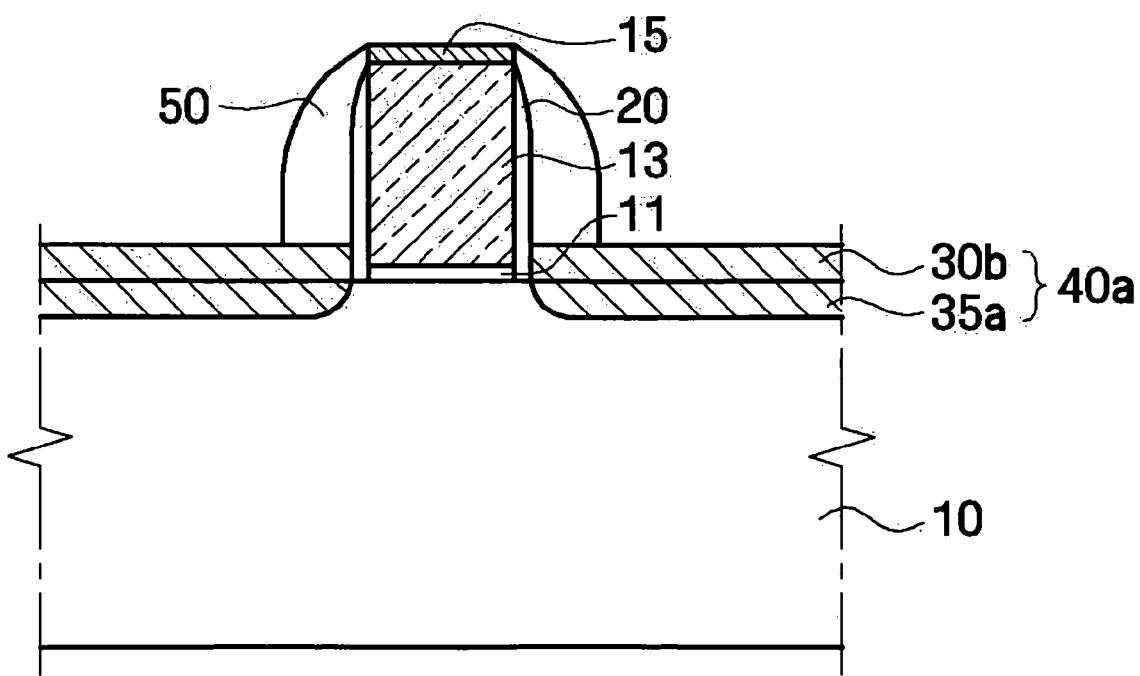

Referring to FIG. 9, the second spacer 50 may be formed on sidewalls of the first spacer. Lower surfaces of the second spacer 50 may contact the epitaxial layer 30b. The second spacer 50 may function as an etching mask when the epitaxial layer is etched in the subsequent process.

An epitaxial pattern may be formed S70.

Figure 10:
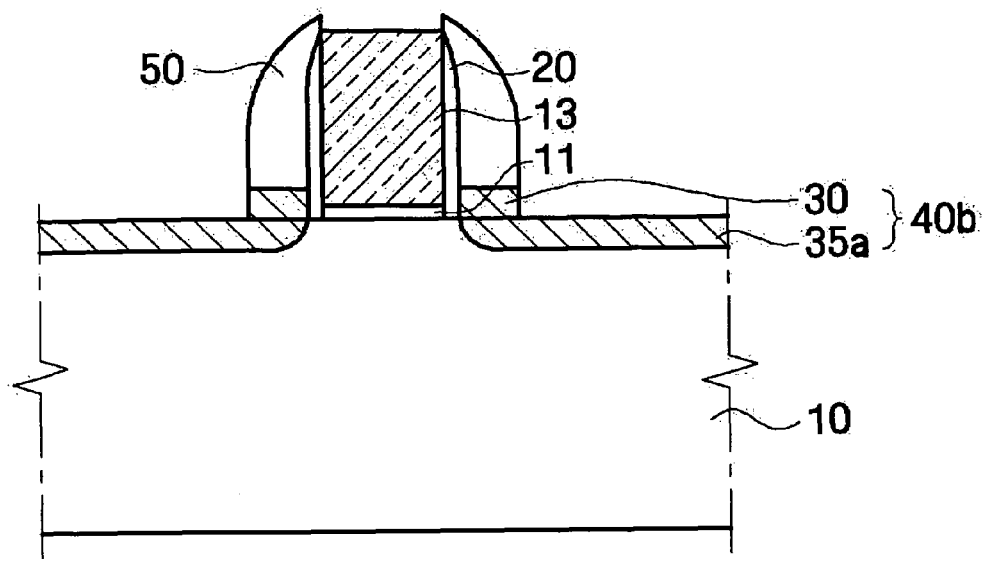

Referring to FIG. 10, the epitaxial pattern 30 may be formed by etching the epitaxial layer 30a using the second spacer 50 as an etching mask and exposing the semiconductor substrate 10. The epitaxial layer 15, formed on the gate electrode 13, may be removed. In example embodiments, the epitaxial patterns may be formed prior to forming the secondary source/drain regions 60 (which will be described later). In other example embodiments, the epitaxial pattern may be formed after the forming the secondary source/drain regions 60.

The secondary source/drain regions may be formed S80.

Figure 11:
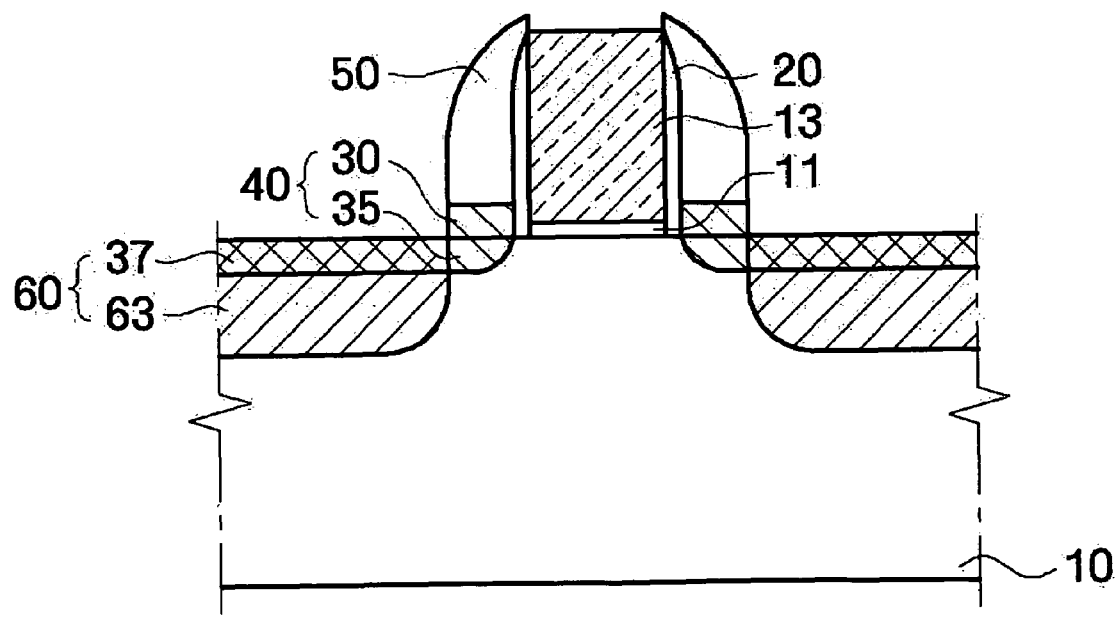

Referring to FIG. 11, the secondary source/drain regions 60 may be formed by injecting dopants into the semiconductor substrate 10, forming source/drain regions including the primary source/drain regions 40 and the secondary source drain region 60.

Reference numeral 37 denotes secondary doped regions formed as a result of injecting dopants to form the primary source/drain and the secondary source/drain. Reference numeral 63 denotes tertiary doped regions formed as a result of injecting dopants to form the secondary source/drain.

A silicide layer may be formed S90.

Figure 12:
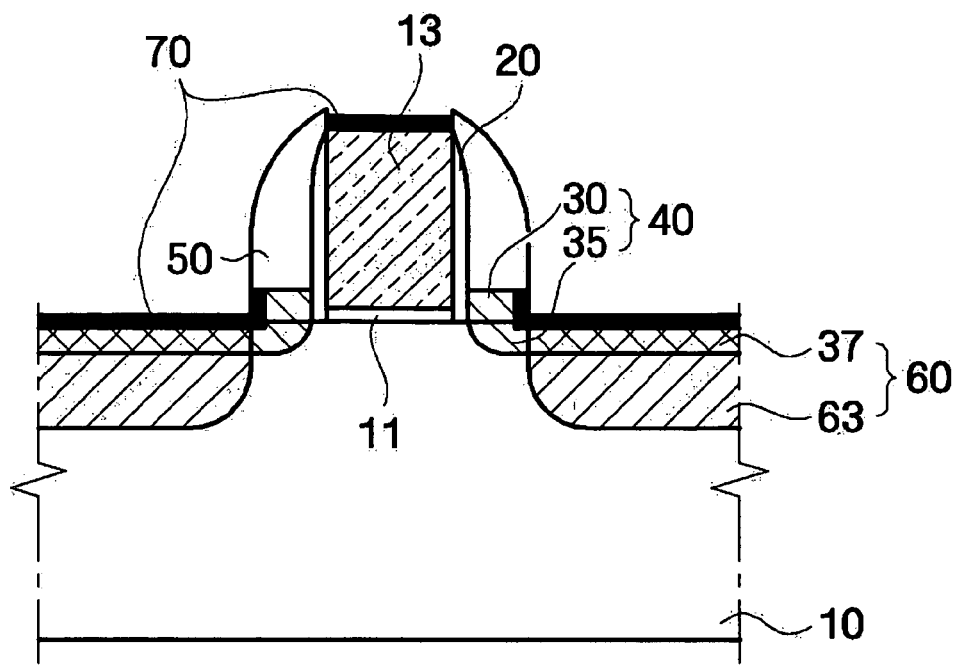

Referring to FIG. 12, the silicide layer 70 may be formed on the gate electrode 13, the source/drain regions and/or side surfaces of the epitaxial pattern 30. The silicide layer 70 may be formed by methods well-known to those skilled in the art.

An enhancer layer may be formed S100.

Figure 13:
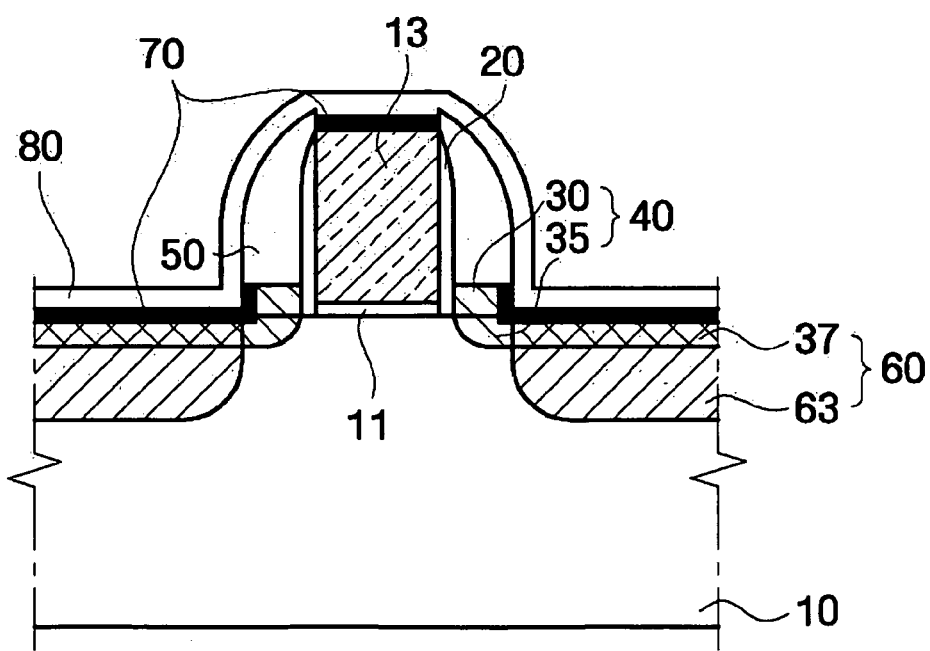

Referring to FIG. 13, the enhancer layer 80 may be formed on the resulting structure. The enhancer layer 80 may contact the source/drain regions, an upper portion of the gate electrode 13 and an upper portion of the second spacer 50.

The enhancer layer 80 may be a layer formed of a material that exhibits a desired tensile strength or compressive strength, as described above. Therefore, a detailed description of the enhancer layer 80 will be omitted for the sake of brevity. The enhancer layer 80 may be formed by methods well-known to those skilled in the art. However, example embodiments are not limited thereto.

After forming the enhancer layer 80, wiring that enables the input and output of electrical signals may be formed.

A passivation layer may also be formed on the semiconductor substrate 10. The semiconductor substrate 10 may be packaged according to steps well-known to those skilled in the art.

Hereinafter, a semiconductor device according to other example embodiments will be described with reference to FIGS. 14 to 16. Like reference numerals designate like elements, and thus detailed descriptions thereof will be omitted for the sake of brevity.

Figure 14:
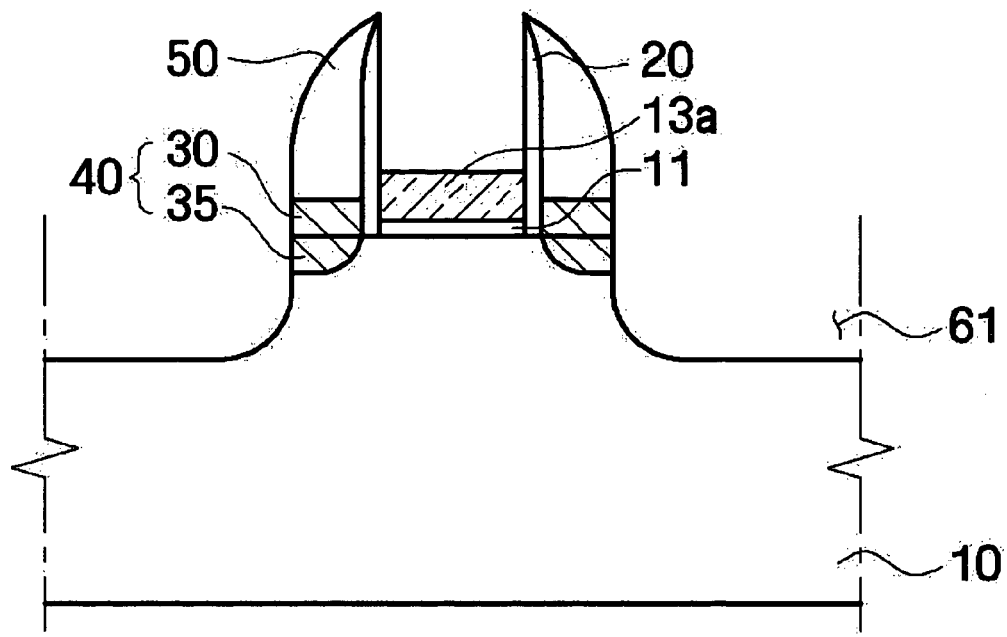

As shown in FIG. 14, when forming an epitaxial pattern 30, a lower part of the semiconductor substrate 10 may be etched, forming a recessed region 61 of a desired depth. When the recessed region 61 is formed, a gate electrode 13 formed of polysilicon layers (e.g., a polysilicon gate layer) may also be etched to form a polysilicon gate layer 13a. The polysilicon gate layer 13a may have a different etching selectivity relative to the gate electrode 13. The polysilicon gate layer 13a may not be etched when etching the gate electrode 14 such that the gate insulating layer 11 may not be exposed.

Figure 15:
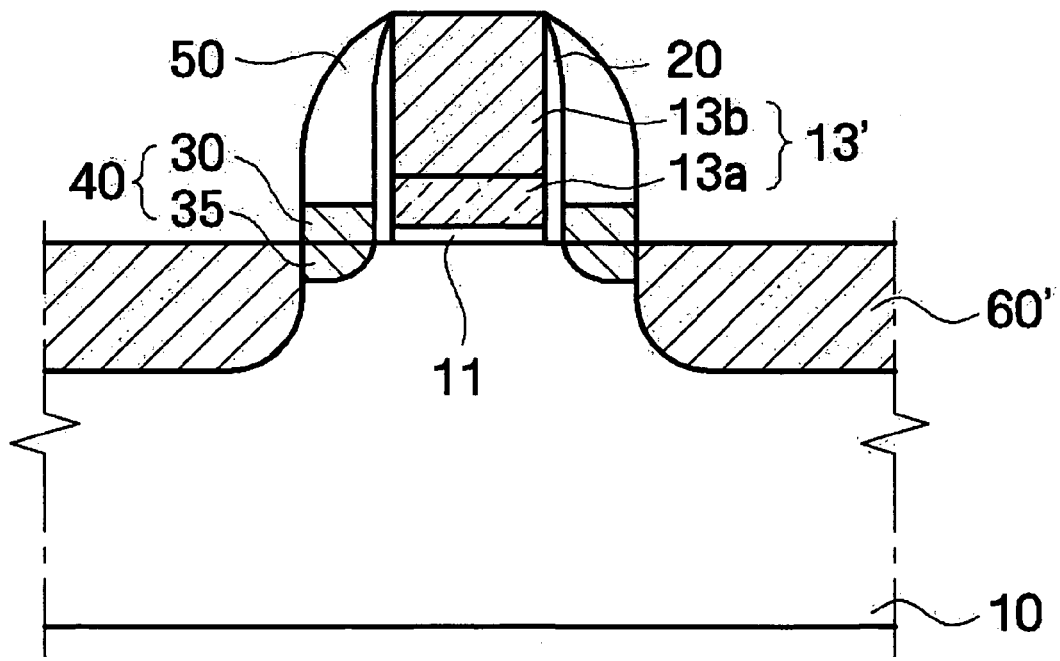

Referring to FIG. 15, a buried epitaxial layer (not shown) may be formed in the recessed region 61 of FIG. 14. Dopants may be injected therein, forming secondary source/drain regions 60'. The dopants, which are injected to form the secondary source/drain regions 60', may be injected in situ after forming the buried epitaxial layer, or ex situ when forming the buried epitaxial layer. Because the epitaxial gate layer 13b may be formed on the upper portion of the polysilicon gate layer 13a when forming the buried epitaxial layer, the gate electrode 13' may be formed into a stack including the polysilicon gate layer 13a remaining and the epitaxial gate layer 13b.

The buried epitaxial layer and the secondary source/drain regions 60' may overlap. In other example embodiments, the secondary source/drain regions 60 and the buried epitaxial layer may not overlap. For instance, when the secondary source/drain regions 60' are formed shallower than the buried epitaxial layer, the secondary source/drain regions 60' may be formed in a lower portion of the semiconductor substrate 10 of the buried epitaxial layer.

The buried epitaxial layer may be formed of Si, SiGe, or SiC. When p-type dopants are injected, it may be desirous to form the buried epitaxial layer of SiGe. When n-type dopants are injected, it may be desirous to form the buried epitaxial layer of SiC.

The epitaxial layer 30b may be buried by a selective epitaxial growth (SEG) process (e.g., low pressure chemical vapor deposition (LPCVD) or ultra-high vacuum chemical vapor deposition (UHV-CVD)). The dopants, which are injected into the secondary source/drain regions 60, may be doped in situ when forming the epitaxial layer 30b.

The buried epitaxial layer may be formed of Si, Ge, and C. Sources of silicon (Si) may include $Si_2H_6$, $SiH_4$, $SiH_2Cl_2$, $SiHCl_3$, or $SiCl_4$. A source of germanium (Ge) may include $GeH_4$. Sources of carbon (C) may include $C_2H_6$, $CH_3SiH_3$. Gases (e.g., HCl or $Cl_2$) may be added to enhance selective characteristics. Gases (e.g., $B_2H_6$ or $PH_3$, and $AsH_3$) may be added thereto for doping purposes. When HCl is added, the epitaxial gate layer 30b may not be formed in an isolation region formed of an oxide or a nitride layer. When HCl is added, the epitaxial layer 30b may be formed in a region with exposed Si.

Selective epitaxial growth process are well-known to those of ordinary skill in the art, and thus, detailed descriptions will be omitted.

Figure 16:
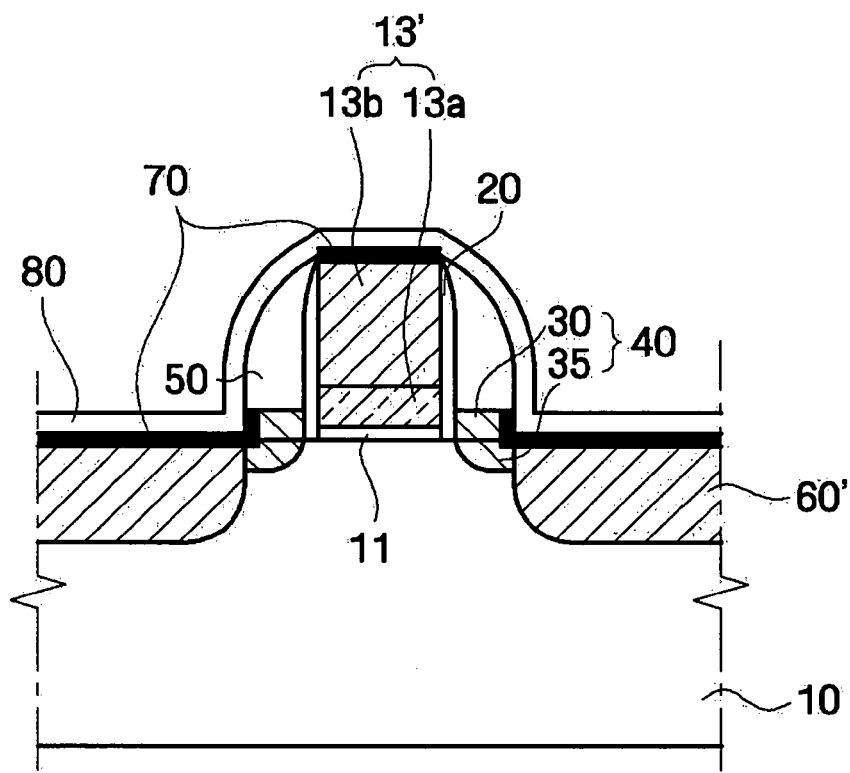

The aforementioned processes described with reference to FIGS. 12 to 13 may be performed in order to form a silicide layer 80, as illustrated in FIG. 16. Detailed descriptions thereof will be omitted for the sake of brevity.

Hereinafter, a semiconductor device according to yet other example embodiments will be described with reference to FIGS. 17 to 22. As in aforementioned example embodiments, like reference numerals designate like elements, and thus detailed descriptions thereof will be omitted for the sake of brevity.

Figure 17:
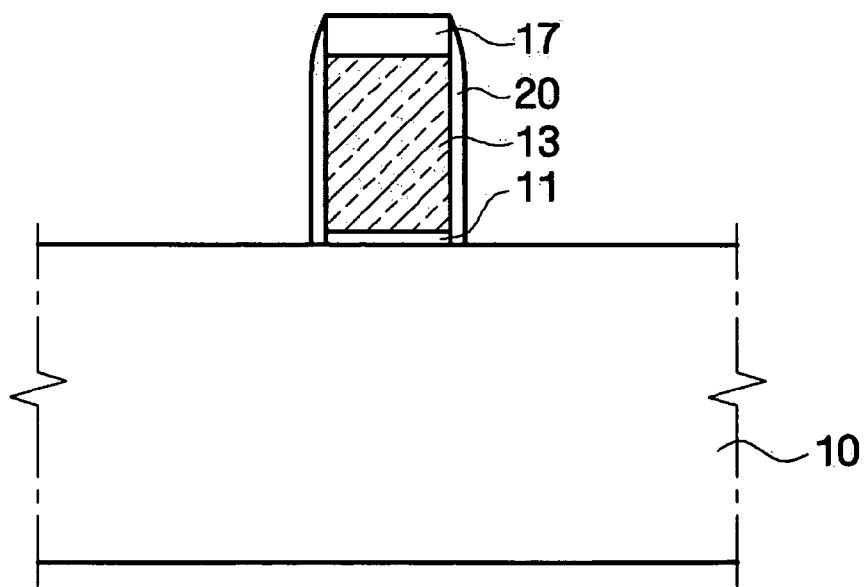

Referring to FIG. 17, a gate electrode 13 including a hard mask 17 may be formed on a gate insulating layer 11 of a semiconductor substrate 10. A first spacer 20 may be formed on sides of the gate electrode 13.

The gate electrode 13 may be a single layer (e.g., a polysilicon layer, a metal layer, or a metal silicide layer or a stacked layer thereof). The hard mask 17 may be a silicon nitride layer or a silicon oxide layer.

Figure 18:
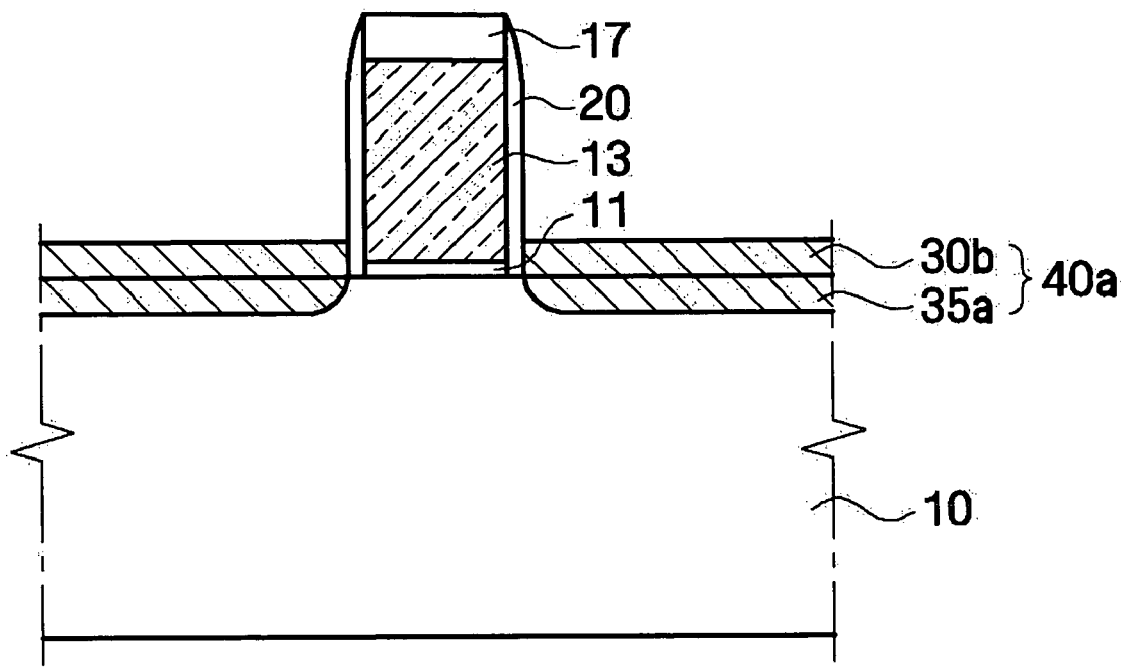

As shown in FIG. 18, an epitaxial layer 30b and extension regions 35a, into which dopants have been injected, may be formed in order to form primary drain/drain regions 40a. Because a hard mask 17 may be formed on a gate electrode 13, the epitaxial layer 30b may not be formed even though the gate electrode 13 is formed of a polysilicon layer.

Figure 19:
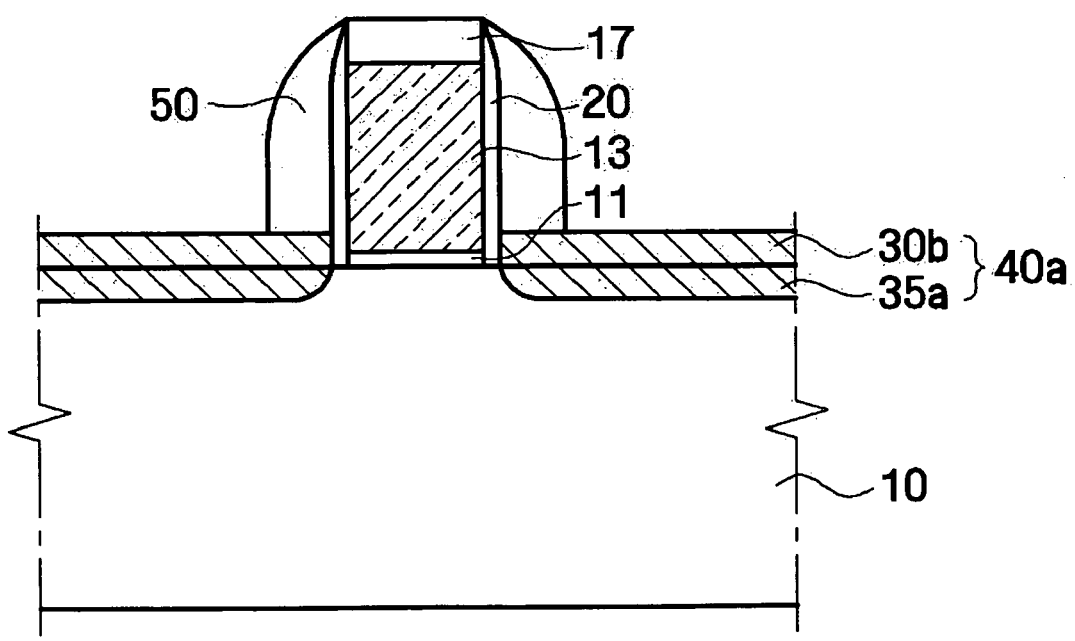

As shown in FIG. 19, a second spacer 50 may be formed on a first spacer 20.

Figure 20:
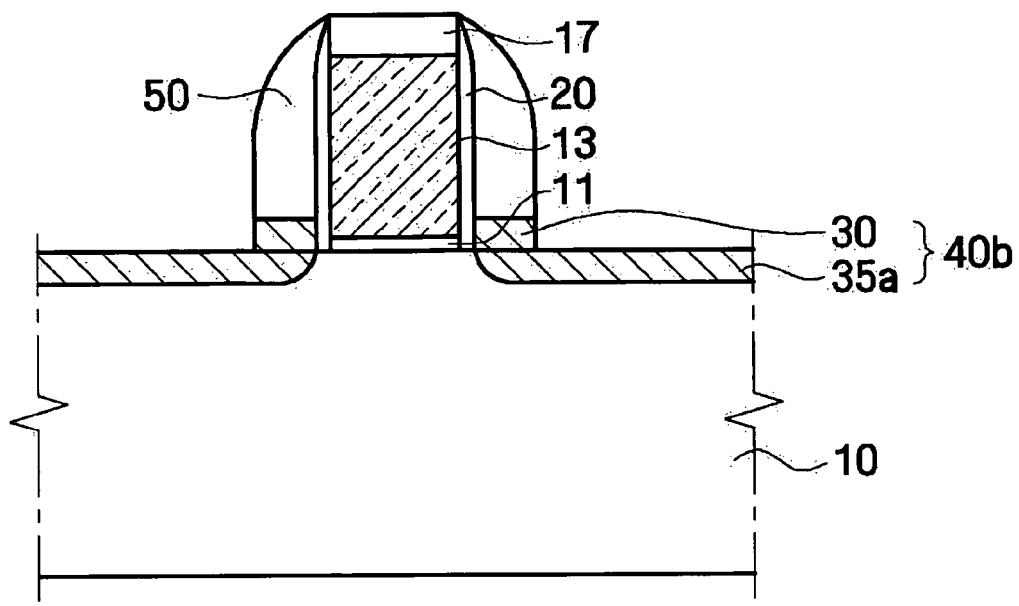

As shown in FIG. 20, an epitaxial pattern 30 may be formed. The epitaxial layer 30b may be etched such that the epitaxial layer is aligned with the second spacer 50. An etch stop layer (not shown) may be formed on an upper portion of the semiconductor substrate 10.

Figure 21:
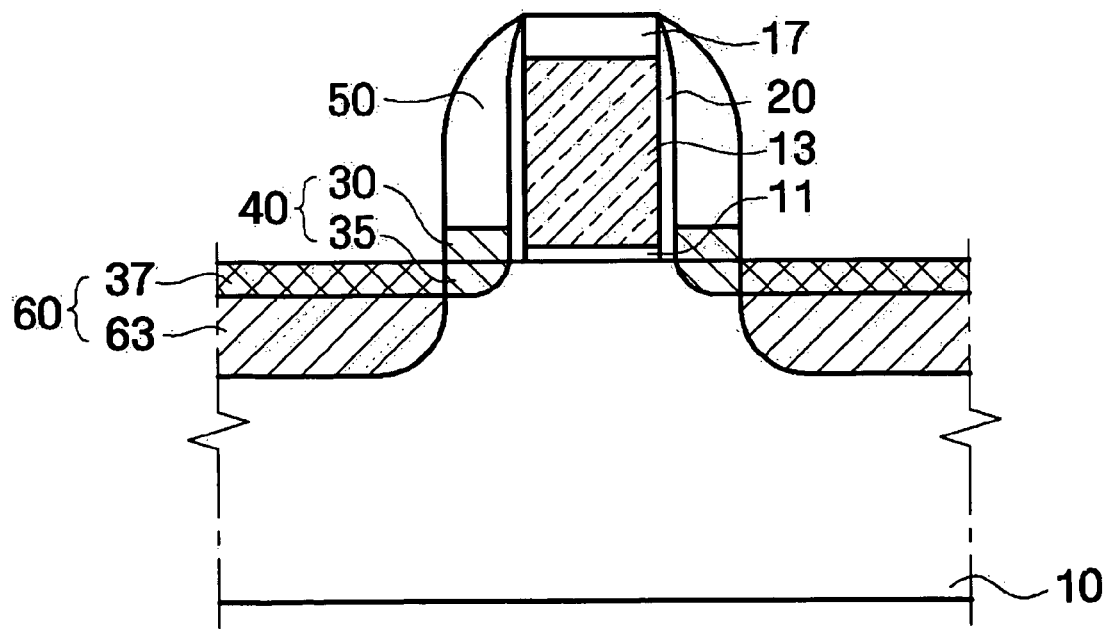

As shown in FIG. 21, secondary source/drain regions 60 may be formed by injecting dopants into the epitaxial pattern 30 and the extension regions 35.

Figure 22:
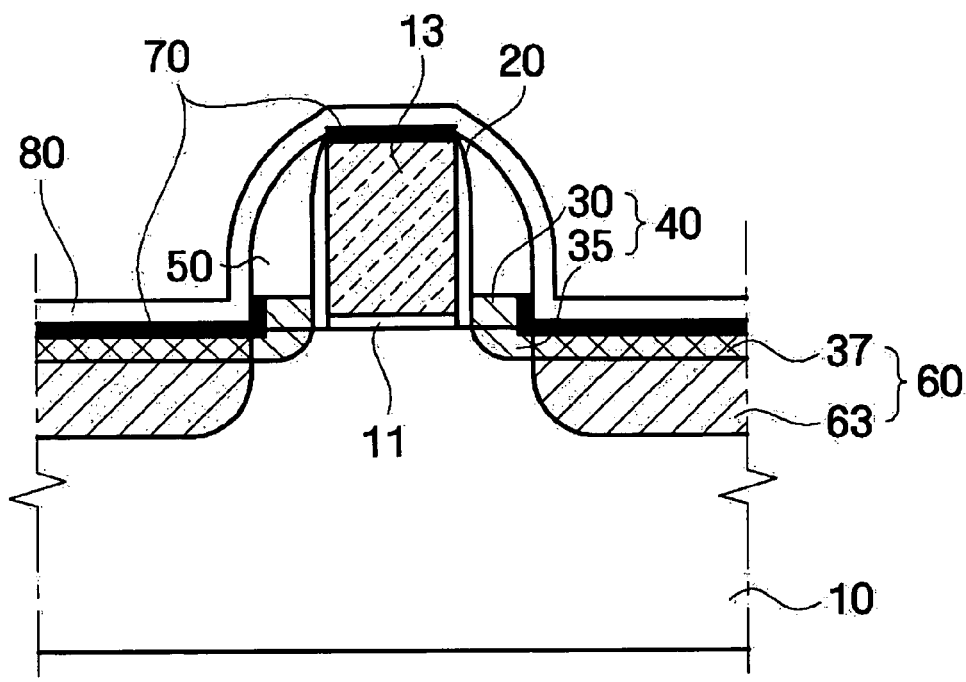

Referring to FIG. 22, a hard mask. 17 formed on a gate electrode 13 may be removed by a dry or wet etching process. However, example embodiments are not limited thereto. A suicide layer 70 may be formed on the gate electrode 13, secondary source/drain regions 60 and/or epitaxial pattern 30. An enhancer layer 80 may be formed on the resulting structure.

Figure 23:
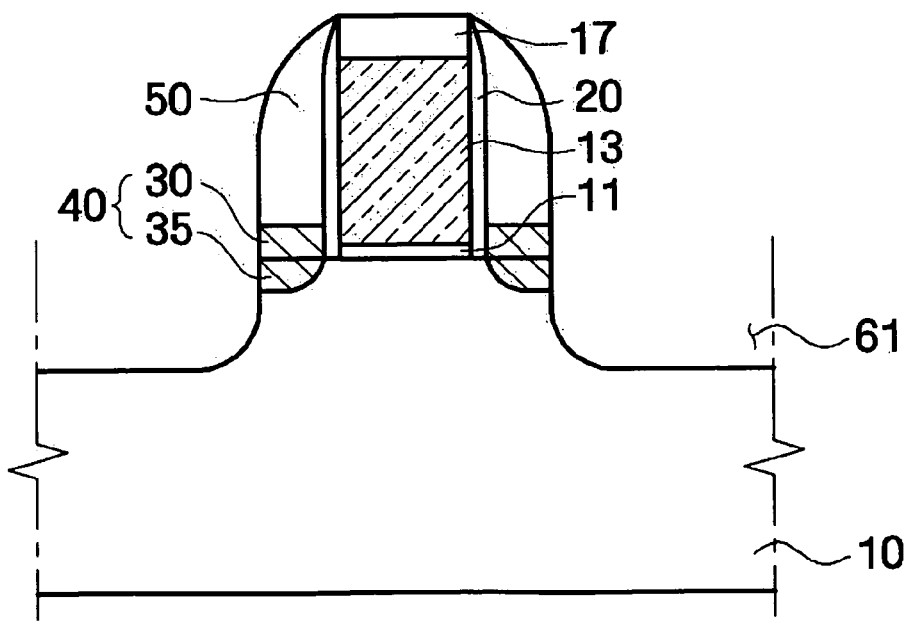

Hereinafter, other example embodiments will be described with reference to FIGS. 23 to 25. Like reference numerals designate like elements, and thus detailed descriptions thereof will be omitted for the sake of brevity. As shown in FIG. 23, a recessed region 61 may be formed inside a semiconductor substrate 10. A hard mask 17 may be formed on a gate electrode 13. The gate electrode 13 may not be etched.

Figure 24:
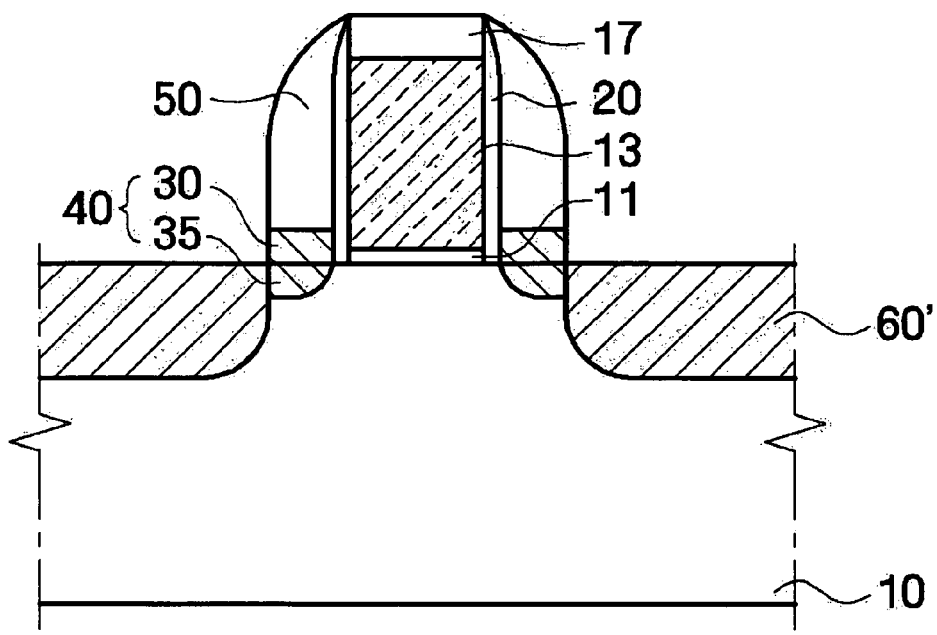

As shown in FIG. 24, a buried epitaxial layer may be formed in the recessed region 61 by a selective epitaxial process. Dopants may be injected into the recessed region 61 to form source/drain regions 60'. Because the hard mask 17 is on the gate electrode 13, additional epitaxial layers may not be formed by the selective epitaxial process.

Figure 25:
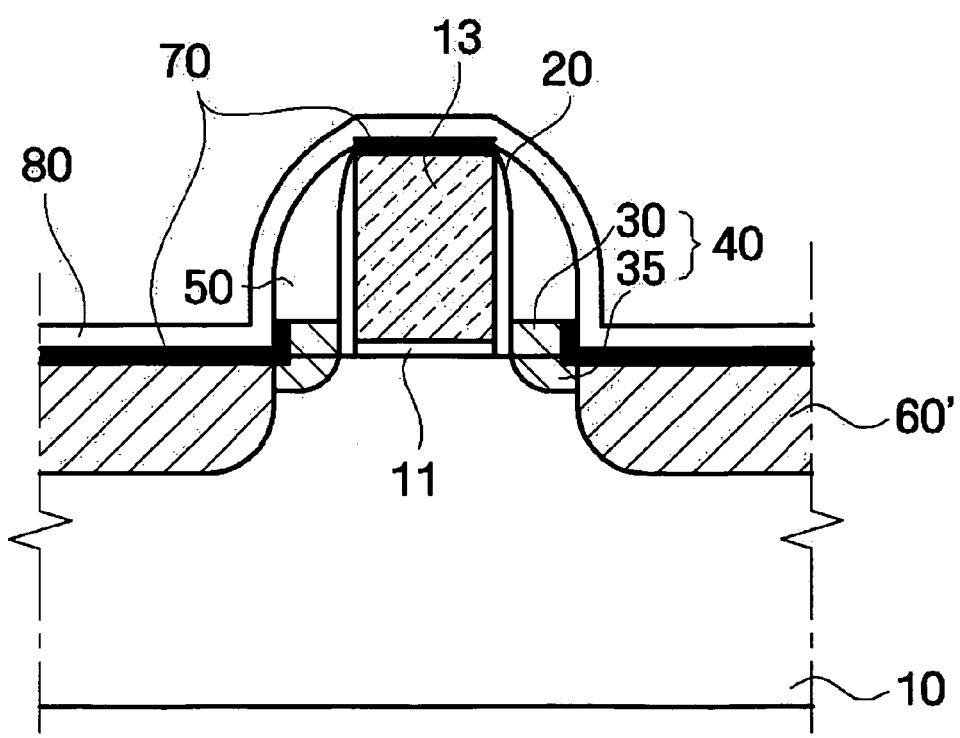

As shown in FIG. 25, an upper side of the gate electrode 13 may be exposed by removing the hard mask 17 thereon by a dry or wet etching process or any other process appreciated in the art. A silicide layer 70 may be formed on the gate electrode 13, secondary source/drain regions 60' and/or an epitaxial pattern 30. An enhancer layer 80 may be formed on the resulting structure.

While some example embodiments have been described in terms of 'primary' and 'secondary' (or the like), the manner used to describe these example embodiments is not intended to establish a preference for one example embodiment over another embodiment.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the example embodiments and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A semiconductor device comprising:
    a semiconductor substrate;
    a gate insulation layer and a gate electrode formed on the semiconductor substrate;
    a first spacer formed on sidewalls of the gate electrode;
    a second spacer formed on sidewalls of the first spacer;
    an epitaxial pattern formed between the second spacer and the substrate wherein an inside profile of the epitaxial pattern is aligned with an inside profile of the second spacer and an outside profile of the epitaxial pattern is aligned with an outside profile of the second spacer; and
    source/drain regions including primary source/drain regions and secondary source/drain regions, wherein the primary source/drain regions are formed in the epitaxial pattern and the semiconductor substrate, and the primary source/drain regions formed in the semiconductor substrate are aligned with the first spacer and the inside profile of the epitaxial pattern, and the secondary source/drain regions are aligned with the second spacer and formed in the semiconductor substrate,
    wherein the inside profile of the second spacer faces the sidewalls of the first spacer, and the outside profile of the second spacer is disposed at the opposite side of the inside profile of the second spacer, and an inside profile of the primary source/drain regions is aligned with an outside profile of the first spacer.

2. The semiconductor device of claim 1, wherein the secondary source/drain regions are formed in a buried epitaxial layer formed in the semiconductor substrate.

3. The semiconductor device of claim 2, wherein the gate electrode includes a polysilicon gate layer and an epitaxial gate layer.

4. The semiconductor device of claim 2, wherein the secondary source/drain regions are p-type and the buried epitaxial layer is formed of silicon germanium (SiGe).

5. The semiconductor device of claim 2, wherein the secondary source/drain regions are n-type and the buried epitaxial layer is formed of silicon carbon (SiC).

6. The semiconductor device of claim 1, further comprising a silicide layer formed on the gate electrode, the secondary source/drain regions and a side surface of the epitaxial pattern.

7. The semiconductor device of claim 6, further comprising an enhancer layer on the source/drain regions.

8. The semiconductor device of claim 7, wherein the source/drain regions are p-type and the enhancer layer is formed of a material that exhibits a desired compressive strength.

9. The semiconductor device of claim 8, wherein the epitaxial pattern is formed of silicon (Si) or silicon germanium (SiGe).

10. The semiconductor device of claim 7, wherein the source/drain regions are n-type and the enhancer layer is formed of a material that exhibits a desired tensile strength.

11. The semiconductor device of claim 10, wherein the epitaxial pattern is formed of silicon (Si) or silicon carbon (SiC).

12. The semiconductor device of claim 1, wherein the source/drain regions are p-type and the epitaxial pattern is formed of silicon (Si) or silicon germanium (SiGe).

13. The semiconductor device of claim 1, wherein the source/drain regions are n-type and the epitaxial pattern is formed of silicon (Si) or silicon carbon (SiC).

14. The semiconductor device of claim 1, further comprising an enhancer layer formed on the source/drain regions.

15. The semiconductor device of claim 1, wherein a bottom of the epitaxial pattern is aligned with a bottom of the gate insulation layer.

16. The semiconductor device of claim 1, wherein the epitaxial pattern is an elevated epitaxial pattern and an elevation of a top surface of the epitaxial pattern is above an elevation of a bottom surface of the gate insulation layer.

* * * * *